(12) United States Patent
Reynolds

(10) Patent No.: US 6,498,513 B1
(45) Date of Patent: Dec. 24, 2002

(54) METASTABILITY RECOVERY CIRCUIT

(75) Inventor: Grahame K. Reynolds, Southampton (GB)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/877,657

(22) Filed: Jun. 7, 2001

(51) Int. Cl.7 .................................................. H03K 3/02
(52) U.S. Cl. ......................... 326/94; 327/198; 327/199; 327/22; 327/23
(58) Field of Search ........................... 326/94; 327/198, 327/199, 22, 23, 19, 269

(56) References Cited

U.S. PATENT DOCUMENTS

| | | | |
|---|---|---|---|
| 5,081,377 A | | 1/1992 | Freyman .................... 307/480 |
| 5,489,865 A | * | 2/1996 | Colvin, Sr. ................. 327/198 |
| 5,638,015 A | | 6/1997 | Gujral et al. ............... 327/144 |
| 5,754,070 A | * | 5/1998 | Baumann et al. ........... 327/198 |
| 5,789,945 A | | 8/1998 | Cline ......................... 326/94 |
| 6,072,346 A | * | 6/2000 | Ghahremani ................ 327/198 |
| 6,111,436 A | * | 8/2000 | Molnar ........................ 327/19 |
| 6,184,701 B1 | | 2/2001 | Kim et al. .................... 326/21 |

OTHER PUBLICATIONS

Grahame K. Reynolds, "Multiport Arbitration Using Phased Locking Arbiters", Ser. No. 09/877,660, filed Jun. 7, 2001.
Grahame K. Reynolds, "Method and Apparatus for the Use of Discriminators for Priority Arbitration", Ser. No. 09/877,659, filed Jun. 7, 2001.
Grahame K. Reynolds, "Driscriminator Circuit", Ser. No. 09/877,658, filed Jun. 7, 2001.

* cited by examiner

*Primary Examiner*—Michael Tokar
*Assistant Examiner*—Vibol Tran
(74) *Attorney, Agent, or Firm*—Christopher P. Maiorana, P.C.

(57) ABSTRACT

An apparatus comprising an arbiter cell and a delay logic circuit. The arbiter cell may be configured to receive a plurality of request signals and provide two or more grant signals. The delay logic circuit may be configured to interface the arbiter cell and force each of the plurality of request signals to be serviced in succession when a metastable state occurs.

20 Claims, 6 Drawing Sheets

METASTABILITY RECOVERY CIRCUIT

CROSS REFERENCE TO RELATED APPLICATIONS

The present application may relate to co-pending application Ser. No. 09/877,659, filed Jun. 7, 2001, and Ser. No. 09/877,660, filed Jun. 7, 2001, and Ser. No. 09/877,658, filed Jun. 7, 2001, which are each hereby incorporated by reference in their entirety.

FIELD OF THE INVENTION

The present invention relates to a method and/or architecture for metastability recovery generally and, more particularly, to an implementation for detecting when a cross coupled arbiter has entered a metastable state and to force each request in succession.

BACKGROUND OF THE INVENTION

Hardware devices are employed within computer systems to assist in determining the availability of computer resources (i.e., a memory chip, a hard disk drive, etc.) which can only be controlled and accessed by one requesting device at a time. However, metastable conditions can exist when contention between requests from different devices occurs. Arbitrators (or arbiters) have been designed to reduce bus contention through flags (or other such means). However, arbitrators can enter metastable states during simultaneous requests. Conventional arbitrators can therefore enter an undecided state and remain for an indefinite period of time, causing undesirable results (i.e., a system crash or hang, etc.).

Referring to FIG. 1, a circuit 10 is shown illustrating a conventional arbitration circuit. The circuit 10 comprises a NAND gate 12, a NAND gate 14 and an interlock circuit 16. The NAND gate 12 receives the signal A and an output,from the NAND gate 14. The NAND gate 14 receives a signal B and an output from the NAND gate 12. The interlock circuit 16 presents a signal OUTA and a signal OUTB in response to the signal from the NAND gates 12 and 14. The NAND gates 12 and 14 are implemented in a cross-coupled configuration. Therefore, the NAND gates 12 and 14 can enter a metastable condition.

Referring to FIG. 2, a timing diagram of the circuit 10 is shown. The input A and the input B are shown crossing between a time T1 and a time T2. The period between the time T1 and T2 illustrates the metastable event which can cause a push out. The circuit 10 is subject to metastability when the inputs A and B change states simultaneously.

The interlock circuit 16 attempts to resolve metastable states, but does not prevent metastable events. The arbitration circuit 10 implements cross coupled NAND arbiters (12 and 14) which cause delays due to metastable events. The resolution (or recovery) time of the cross coupled arbiters 12 and 14 is not a, predictable. While the interlock circuit 16 can try to prevent metastable states from occurring on the outputs, the interlock circuit 16 does not resolve the occurrence of the metastable events. Conventional arbitrators attempt to reduce the probability of metastable occurrences rather than eliminate such occurrences.

It is desirable to provide a method and/or architecture that eliminates metastable conditions due to simultaneous requests.

SUMMARY OF THE INVENTION

The present invention concerns an apparatus comprising an arbiter cell and a delay logic circuit. The arbiter cell may be configured to receive a plurality of request signals and provide two or more grant signals. The delay logic circuit may be configured to interface the arbiter cell and force each of the plurality of request signals to be serviced in succession when a metastable state occurs.

The objects, features and advantages of the present invention include providing a method and/or architecture for detecting when a cross coupled arbiter has entered a metastable state that may (i) force each request in succession, (ii) be implemented in dual port memory applications, (iii) reduce or eliminate delays due to metastability issues, (iv) implement an interlock element to disable outputs until a metastable condition is resolved, (v) implement low voltage threshold inverters to avoid oscillation, (vi) provide a controlled arbitration time and/or (vii) arbitrate between requests for access to a memory.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
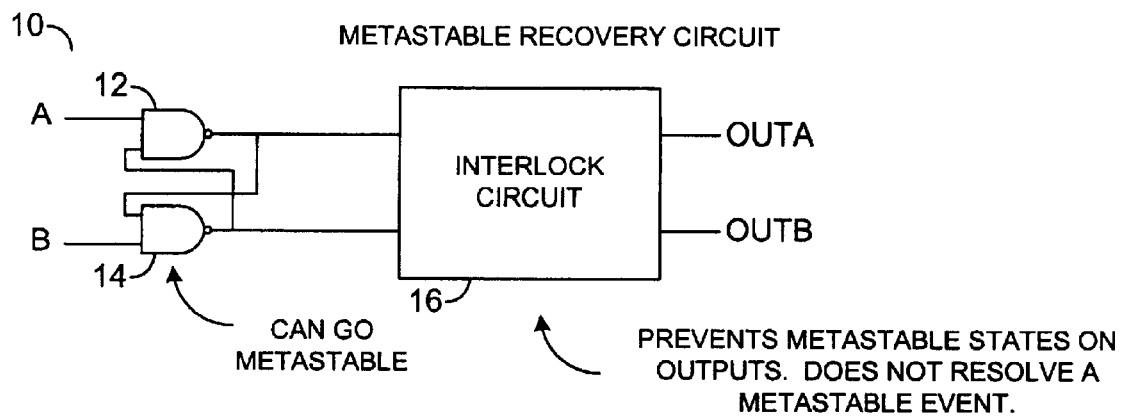
FIG. 1 is a block diagram of a conventional metastable recovery circuit.
Figure 2:
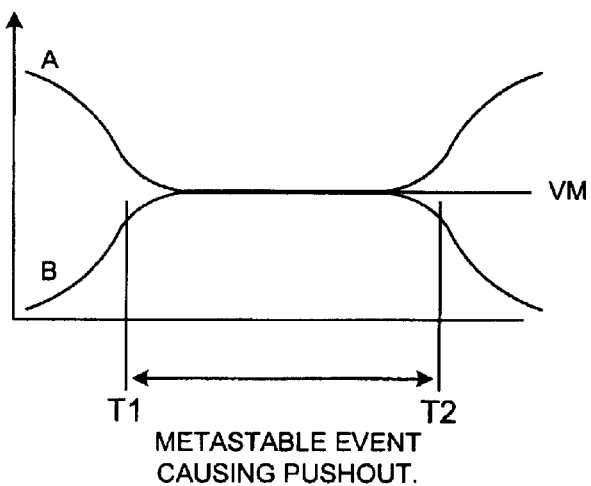
FIG. 2 is a timing diagram of the conventional circuit of FIG. 1.
Figure 3:
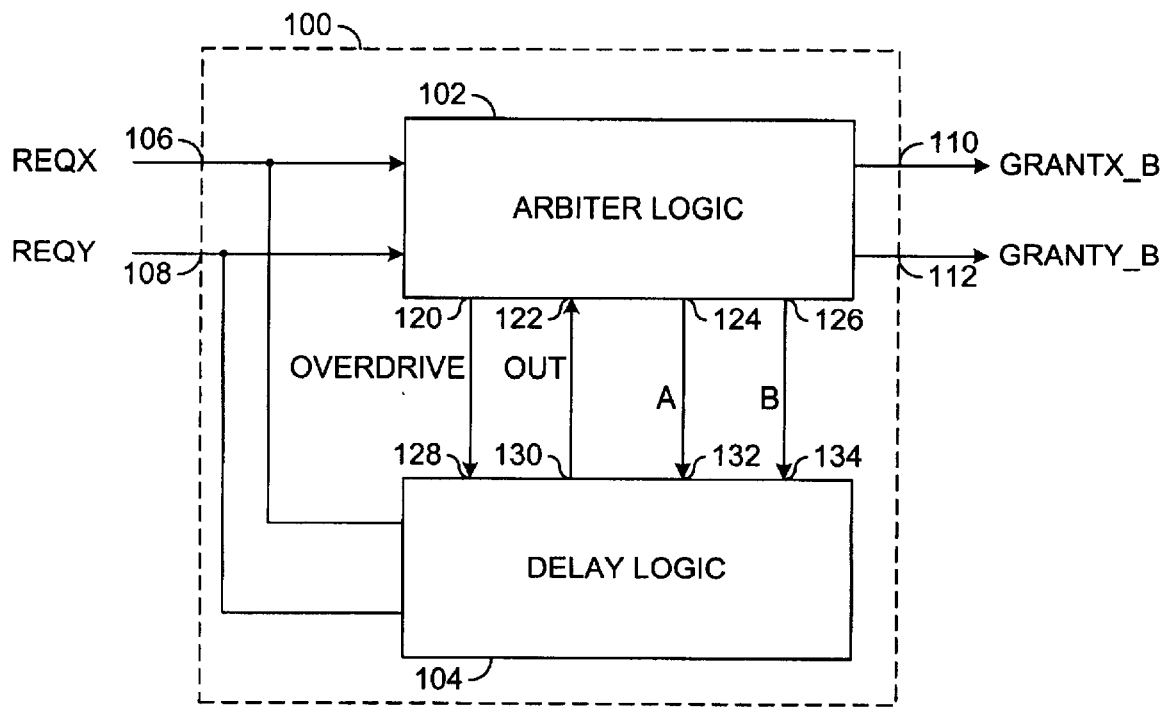
FIG. 3 is a block diagram of a preferred embodiment of the present invention.

Referring to FIG. 3, a block diagram of a circuit 100 is shown in accordance with a preferred embodiment of the present invention. The circuit 100 may be implemented as a metastability recovery circuit. The circuit 100 may detect when a cross coupled arbiter has entered a metastable state (e.g., due to coincident requests) and force each request in succession. Additionally, the circuit 100 may implement a predetermined resolution delay to provide a controlled arbitration time.

The circuit 100 generally comprises a circuit 102 and a circuit 104. The circuit 102 may be implemented as an arbiter logic circuit. The circuit 104 may be implemented as a delay logic circuit. The circuit 100 may have an input 106 that may receive a signal (e.g., REQX), an input 108 that may receive a signal (e.g., REQY), an output 110 that may present a signal (e.g., GRANTX_B) and an output 112 that may present a signal (e.g., GRANTY_B). The signals REQX and REQY may be implemented as request signals. The request signals REQX and REQY may be active high. Additionally, once a request has been serviced an acknowledgment signal (not shown) may indicate that the request is completed. The requests signals REQX and REQY may then be de-asserted. The signals GRANTX_B and GRANTY_B may be grant signals.

The signals REQX and REQY may be presented to both the arbiter logic 102 and the delay logic 104. The arbiter logic 102 may have an output 120 that may present a signal (e.g., OVERDRIVE), an input 122 that may receive a signal (e.g., OUT), an output 124 that may present a signal (e.g., A) and an output 126 that may present a signal (e.g., B). The signals A and B may be intermediate outputs of the arbiter logic 102. The signal A may indicate when the request REQX is accepted and active (e.g., low). The signal B may function similarly for the request REQY. The signals A and B may then return to an inactive state (e.g., high) when the relevant signal REQX or REQY is de-asserted.

The delay logic circuit 104 may have an input 128 that may receive the signal OVERDRIVE, an output 130 that may present the signal OUT, an input 132 that may receive the signal A and an input 134 that may receive the signal B. The signal OUT may indicate that the arbiter logic 102 is not resolved in a predetermined period of time. A discriminator circuit (to be discussed further in connection with FIGS. 4 and 8) may be set when the predetermined period of time is not met and reset when the signals GRANTX and GRANTY are resolved after a settling delay. The signals OVERDRIVE, OUT, A and B may allow the arbiter logic circuit 102 and the delay logic circuit 104 to interface.

Figure 4:
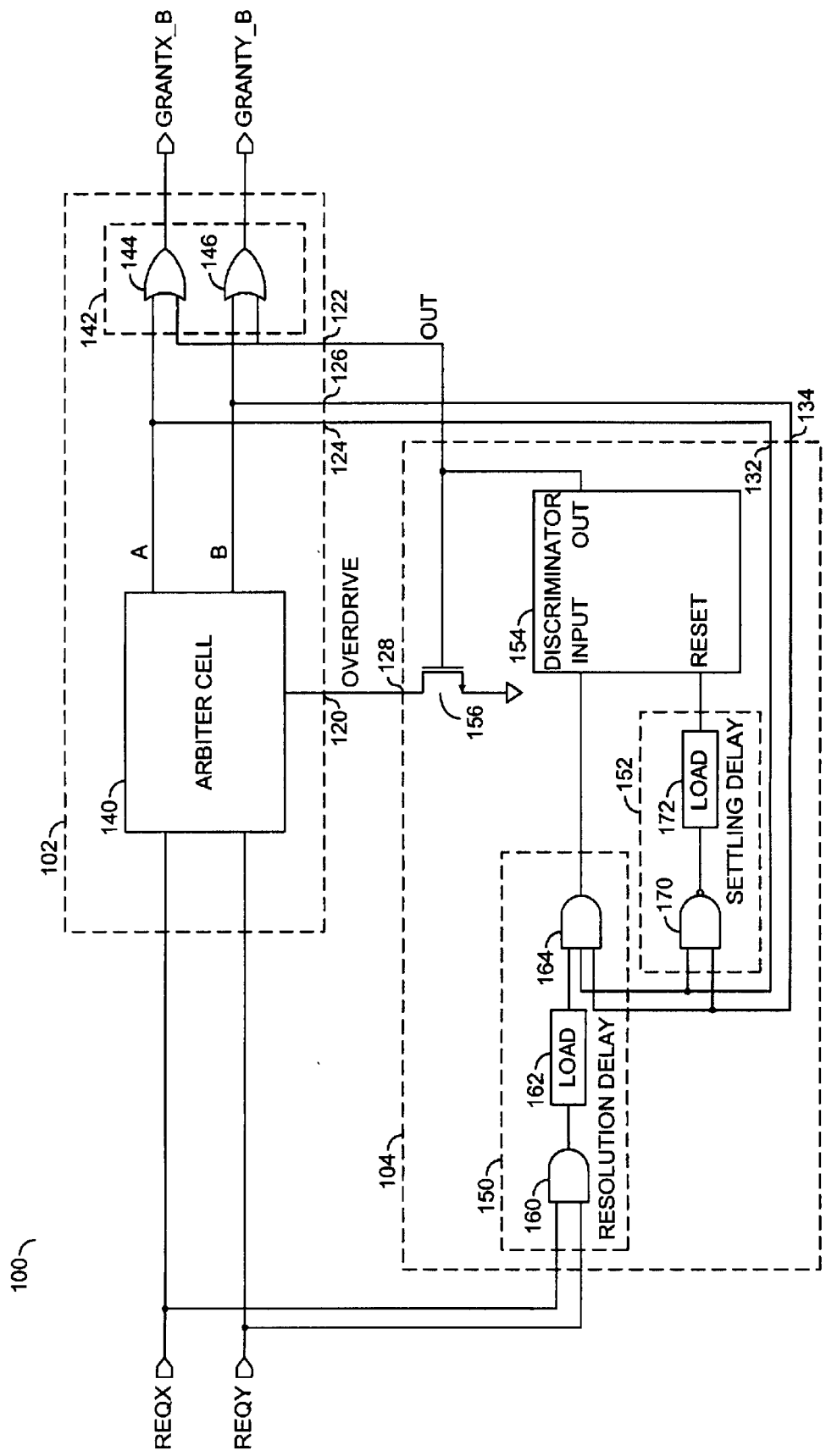
FIG. 4 is a detailed block diagram of the circuit of FIG. 3.

Referring to FIG. 4, a more detailed diagram of the arbiter logic 102 and the delay logic 104 are shown. The arbiter circuit 102 generally comprises an arbiter cell 140 and a circuit 142. The circuit 142 may be implemented as an output logic circuit. The output logic circuit 142 generally comprises a gate 144 and a gate 146. The gates 144 and 146 are shown implemented as OR gates. However, various combinations of gates may be implemented accordingly to meet the design criteria of a particular implementation.

The circuit 104 generally comprises a circuit 150, a circuit 152, a circuit 154 and a device 156. The circuit 150 may be implemented as an input circuit. The circuit 152 may be implemented as a reset circuit. The circuit 154 may be implemented as a discriminator (to be discussed further in connection with FIG. 8). The device 156 may be implemented as a transistor. The circuit 150 may receive the signals REQX, REQY, A and B. The circuit 150 may also present a signal to an input of the circuit 154. The circuit 152 may be configured to receive the signals A and B and present a signal to a reset input of the circuit 154. An output of the circuit 154 may be coupled to the node OUT. The signal OUT may control the output of the arbiter logic circuit 102. The device 156 is shown connected between the signal OVERDRIVE and ground, while receiving the signal OUT at a gate.

The circuit 150 generally comprises a gate 160, a circuit 162 and a gate 164. The gates 160 and 164 are shown implemented as AND gates. However, other combinations of gates may be implemented accordingly to meet the design criteria of a particular implementation. The circuit 162 may be implemented as a delay circuit. In one example, the circuit 162 may be implemented as a resolution delay circuit. The resolution delay circuit 162 may have a programmable (or configurable) delay. The circuit 152 generally comprises a gate 170 and a circuit 172. The gate 170 is shown implemented as a NAND gate. However, other gates may be implemented accordingly to meet the design criteria of a particular implementation. The circuit 172 may be implemented as a delay circuit. In one example, the circuit 172 may be implemented as a settling delay circuit. The settling delay circuit 172 may have a programmable (or configurable) delay.

Figure 5:
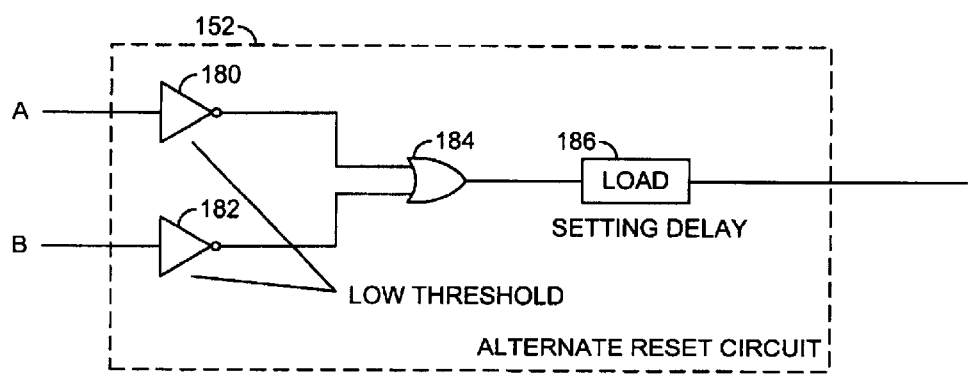
FIG. 5 is a block diagram of an alternate reset circuit of FIG. 4.

Referring to FIG. 5, an alternate example of the circuit 152 is shown. The circuit 152 is shown comprising an inverter 180, an inverter 182, a gate 184 and a circuit 186. The gate 184 is shown implemented as an OR gate. The inverters 180 and 182 may be alternately implemented as inverter inputs to the gate 184. Additionally, other combinations of gates and/or inverters may be implemented accordingly to meet the design criteria of a particular implementation. The circuit 186 may be implemented as a delay circuit. In one example, the circuit 186 may be implemented as a settling delay circuit. The settling delay circuit may have a programmable (or configurable) delay.

Figure 6:
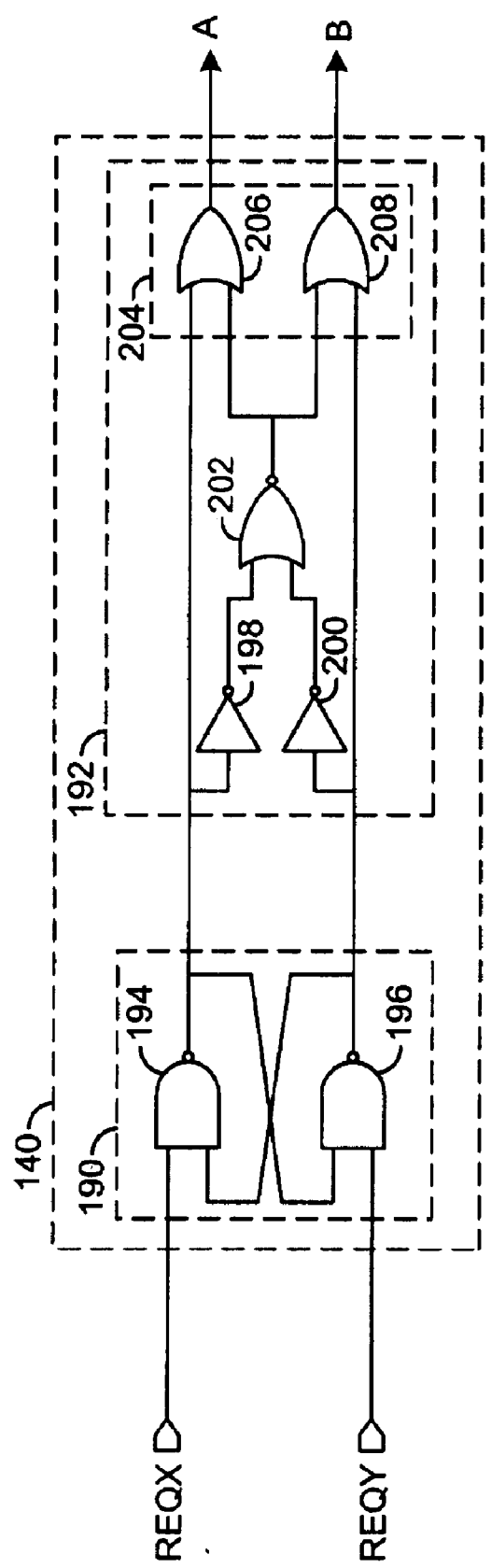
FIG. 6 is a detailed block diagram of the arbiter circuit of FIG. 4.

Referring to FIG. 6, a detailed diagram of the arbiter cell 140 is shown. The arbiter cell 140 generally comprises an arbiter 190 and an interlock element 192. The arbiter 190 generally comprises a gate 194 and a gate 196. The gates 194 and 196 may be cross coupled. In one example, the gates 194 and 196 may be implemented as NAND gates. However, other combinations of gates may be implemented accordingly in order to meet the design criteria of a particular implementation.

The interlock circuit 192 generally comprises an inverter 198, an inverter 200, a gate 202 and an output block 204. The output block 204 generally comprises a gate 206 and a gate 208. The gates 206 and 208 may be implemented as OR gates. However, other combinations of gates may be implemented in order to meet the design criteria of a particular implementation. The interlock element 192 may disable the outputs of the gates 194 and 196 until a metastable condition is resolved. The inverters 198 and 200 may be implemented as inverters with low threshold voltages to avoid oscillation.

Figure 7:
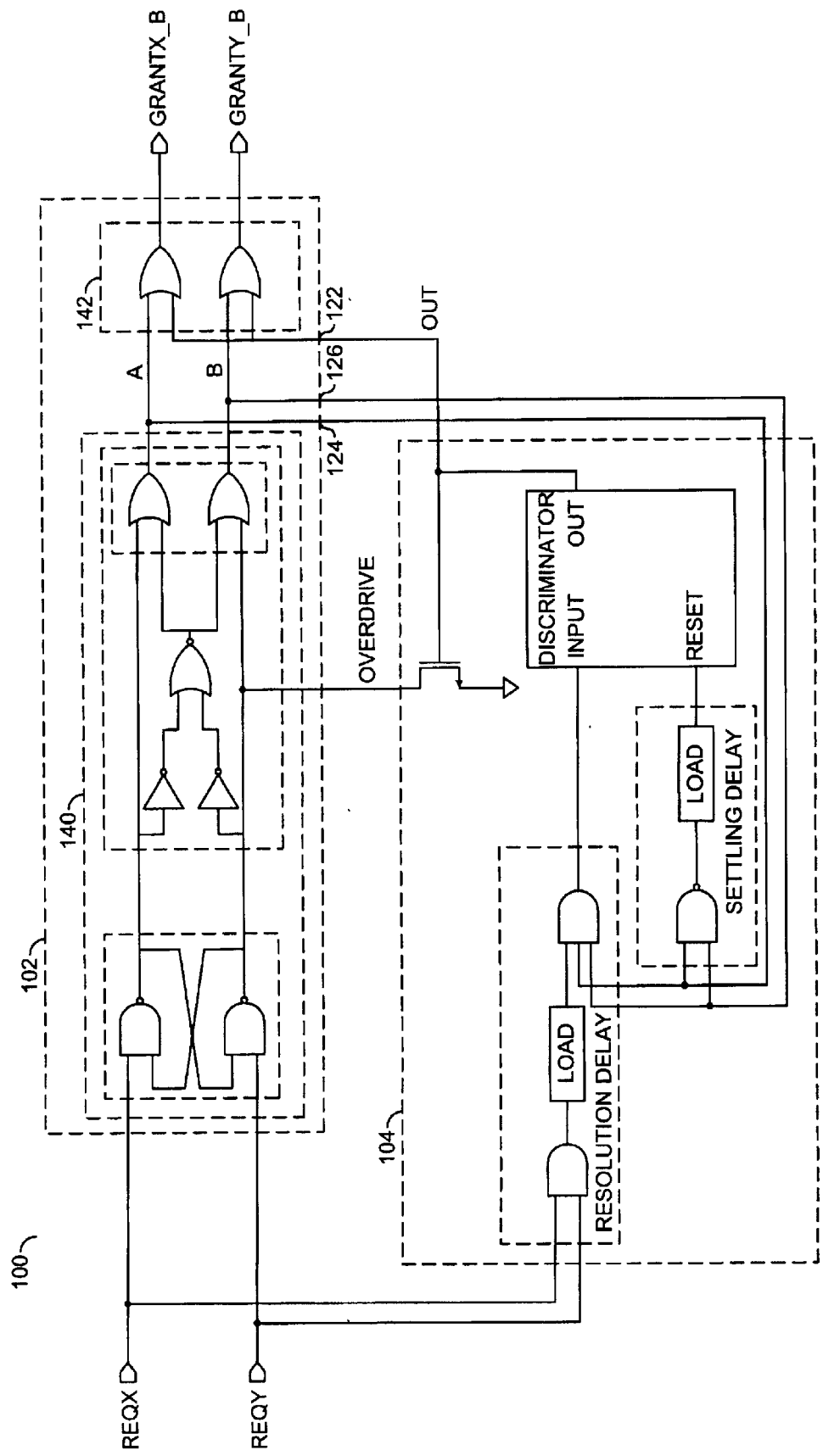
FIG. 7 is an overview of the present invention.

Referring to FIG. 7, a general overview of the circuit 100 is shown. The circuit 100 may be implemented as a recovery circuit configured to detect when the cross coupled arbiter 190 enters a metastable state (due to coincident requests). The circuit 100 may then force each request to be serviced in succession. The interlock element 192 may implement the low threshold voltage inverters 198 and 200 to sense and conceal metastable events.

Figure 8:
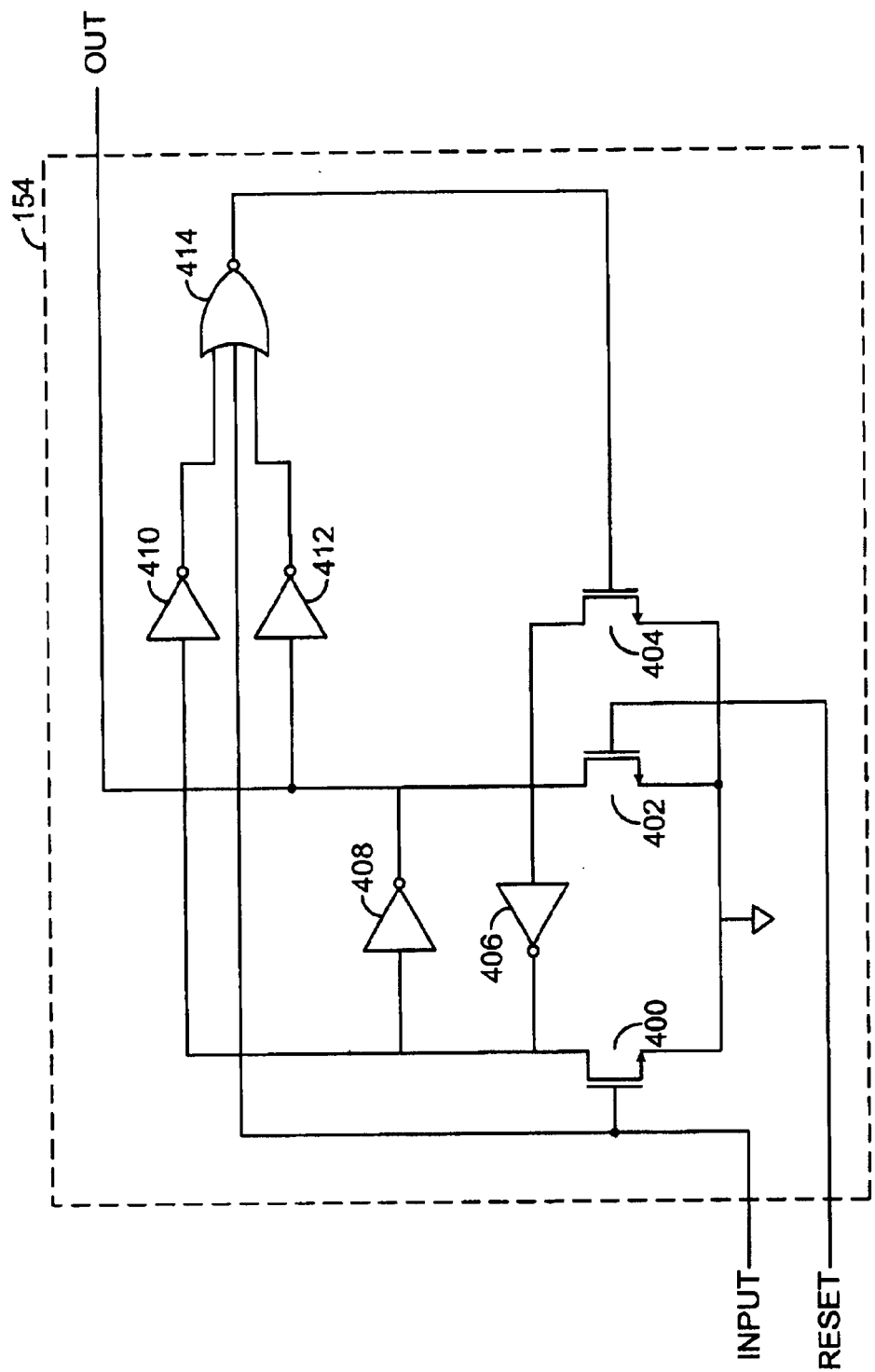
FIG. 8 is a block diagram of a discriminater of the present invention.

Referring to FIG. 8, a detailed diagram of the discriminator circuit 154 is shown. The various discriminators of the present invention may be similar to the discriminator 154. The discriminator 112 generally comprises a transistor 400, a transistor 402, a transistor 404, an inverter 406, an inverter 408, an inverter 410, an inverter 412 and a gate 414. The gate 414 may be implemented as an NOR gate. The inverters 406 and 408 may be implemented as inverters with high thresholds., The inverters 410 and 412 my be implemented as inverters with low thresholds. The low threshold inverters 410 and 412 may be implemented to sense and conceal metastable events. Alternatively, the inverters 410 and 412 may be implemented as inverter inputs to the gate 414. The transistors 400, 402 and 404 may be implemented as CMOS transistors. However, other appropriate type transistors may be implemented to meet a particular criteria.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) accordingly to meet the design criteria of a particular implementation.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   an arbiter cell configured to receive a plurality of request signals and provide two or more grant signals; and
   a delay logic circuit configured to interface to said arbiter cell and force each of said plurality of request signals to be serviced in succession when a metastable state occurs, wherein said apparatus comprises a metastability recovery circuit.

2. The apparatus according to claim 1, wherein said delay logic circuit comprises:
   a first delay configured to delay said apparatus for a first period of time.

3. The apparatus according to claim 2, wherein said delay logic circuit further comprises:
   a second delay configured to delay said apparatus for a second period of time.

4. The apparatus according to claim 3, wherein said first and second periods of time are programmable.

5. The apparatus according to claim 3, wherein said first period of time comprises a resolution period of time and said second period of time comprises a settling period of time.

6. The apparatus according to claim 1, wherein said circuit is configured to arbitrate access to a multiport memory.

7. The apparatus according to claim 1, wherein said delay logic circuit comprises:
   a first logic circuit;
   a second logic circuit; and
   a discriminator coupled to said first and second logic circuits and configured to interface with said arbiter cell.

8. The apparatus according to claim 7, wherein:
   said first logic circuit comprises an input logic circuit configured to delay an input of said discriminator; and
   said second logic circuit comprises a reset logic circuit configured to delay a reset of said discriminator.

9. The apparatus according to claim 1, wherein said circuit is configured to provide a controlled arbitration time.

10. An apparatus comprising:
    means for providing two or more grant signals in response to a plurality of request signals;
    means for interfacing with an arbiter cell; and
    means for forcing said plurality of request signals to be serviced in succession when a metastable state occurs, wherein said apparatus comprises a metastability recovery circuit.

11. A method for providing arbiter device configured to arbitrate between a plurality of request signals, comprising the steps of:

(A) providing two or more grant signals in response to said plurality of request signals;
    (B) interfacing with an arbiter device; and
    (C) forcing said plurality of request signals to be serviced in succession when a metastable state occurs, wherein said arbiter device comprises a metastability recovery circuit.

12. The method according to claim 11, further comprising the step of:
    delaying for a first period of time.

13. The method according to claim 12, further comprising the step of:
    delaying for a second period of time.

14. The method according to claim 13, wherein said first and second periods of time are programmable.

15. The method according to claim 13, wherein said first period of time comprises a resolution period of time and said second period of time comprises a settling period of time.

16. The method according to claim 11, wherein step (C) further comprises:
    arbitrating access to a multiport memory.

17. The method according to claim 11, wherein step (C) further comprises:
    resetting in response to a reset signal.

18. The method according to claim 11, wherein step (C) further comprises:
    providing controlled arbitration time.

19. An apparatus comprising:
    an arbiter cell configured to receive a plurality of request signals and provide two or more grant signals; and
    a delay logic circuit comprising a first programmable delay and a second programmable delay, said delay logic circuit configured to interface with said arbiter cell and force each of said plurality of request signals to be serviced in succession when a metastable state occurs.

20. An apparatus comprising:
    an arbiter cell configured to receive a plurality of request signals and provide two or more grant signals; and
    a delay logic circuit configured to interface with said arbiter cell and force each of said plurality of request signals to be serviced in succession when a metastable state occurs, wherein said apparatus is configured to provide a controlled arbitration time.

* * * * *